United States Patent
Tsai et al.

[19]

[11] Patent Number: 6,117,726
[45] Date of Patent: Sep. 12, 2000

[54] METHOD OF MAKING A TRENCH CAPACITOR

[75] Inventors: Hsin-Chuan Tsai, Taipei; Pei-Ing Paul Lee, Taipei Hsien, both of Taiwan

[73] Assignee: Nan Ya Technology Corporation, Taiwan

[21] Appl. No.: 09/326,668

[22] Filed: Jun. 7, 1999

[30] Foreign Application Priority Data

Nov. 26, 1998 [TW] Taiwan ................................ 87119676

[51] Int. Cl.$^7$ .............................................. H01L 21/8242
[52] U.S. Cl. ........................... 438/242; 438/243; 257/302
[58] Field of Search .................................... 438/386, 242, 438/253, 243, 244, 247, 248, 387, 389, 391; 257/301, 302

[56] References Cited

U.S. PATENT DOCUMENTS 5,395,786 3/1995 Hsu et al. .................................... 437/52
5,658,816 8/1997 Rajeevakumar ........................ 438/386

OTHER PUBLICATIONS

Abstract for L. Nesbit, et al., "A 0.6 $\mu m^2$ 265Mb Trench DRAM Cell With Self–Aligned BuriEd STrap (BEST)", 1993 IEDM, pp. 627–630.

Primary Examiner—Tom Thomas
Assistant Examiner—Nitin Parekh
Attorney, Agent, or Firm—George T. Marcou; Kilpatrick Stockton LLP

[57] ABSTRACT

A method of making a trench capacitor including the following steps: forming a first trench of predetermined depth into a semiconductor substrate; forming an electrode plate on the side-wall of a bottom of the first trench; forming a dielectric layer on the electrode plate; forming a first conductive portion on the dielectric layer, wherein the first conductive portion fills the bottom of the first trench to form a second trench; forming an insulation layer to fill the bottom portion of the second trench to make a third trench in the second trench; forming a conductive spacer along the side-wall of the third trench; etching the insulation layer using the conductive spacer as a mask to form a forth trench; and then filling the forth trench with a conductive material.

27 Claims, 11 Drawing Sheets

METHOD OF MAKING A TRENCH CAPACITOR

BACKGROUND OF THE INVENTION

1. Field of the Invention

The present invention relates to a method of making a trench capacitor. More particularly, the present invention relates to a process for fabricating a semiconductor trench capacitor within a dynamic random access memory (DRAM) cell.

2. Description of Related Art

Due to the extensive use and broad range of applications for integrated circuits, a wide variety of semiconductor memory devices have been developed. In these semiconductor memory devices, dynamic random access memory (DRAM) presently plays an important role. Today, most DRAM cells consist of at least a transistor and a capacitor. FIG. 1 shows a structure of a DRAM cell. A drain electrode of a NMOS transistor is connected to a storage electrode of a capacitor 20 and a gate of the NMOS transistor is connected to a word line WL. An opposed electrode of the capacitor 20 is connected to a voltage source supplying a constant voltage, and between the storage electrode and the opposed electrode exists a dielectric layer. By controlling the ON or OFF state of the NMOS transistor, the capacitor saves or releases electric charges to perform the level-memory function of the memory cell.

In DRAM with the capacity of one megabyte, a planar type capacitor is typically used to access electric data, i.e. to save or release electric charges. It is known that because the planar type capacitor has a two-dimensional structure, a large area of the semiconductor substrate is used to form the planar type capacitor to supply enough capacity for a DRAM cell. But there exists a continuing demand for inexpensive DRAM having increased memory and reduced chip size. The reduced-size chip limits the area available for forming the planar type capacitor and thus the capacity of planar type capacitor is reduced. Therefore, the planar type capacitor can not meet the requirements for DRAM with a higher and higher density of integrated circuits.

To improve the above drawback of the planar type capacitor, a three-dimension structure for DRAM capacitors is disclosed in the prior art. In U.S. Pat. No. 5,395,786, U.S. Pat. No. 5,658,816, and L. Nesbit, et al, "A 0.6 μm 265 Mb Trench DRAM Cell With Self-Aligned BuriEd STrap (BEST)", 1993 IEDM, pp. 627–630 disclose relevant technologies for a trench type capacity used for DRAM cell. By using said semiconductor processes for the capacitors of DRAM cells, the area occupied by the capacitors on the substrate is significantly reduced to increase the density of integrated circuits. In the process to form trench capacitors, isolation layers (e.g. ON layer or ONO layer) and conduction layers (e.g. formed by n+ polysilicon) are deposited and etched many times. For general processes, a predetermined pattern on a mask is used to etch the photoresist layer and the substrate to form a trench. A charge storage portion (capacitor plate) and an insulating layer are formed along the side-wall of the trench. Finally, a conductive material is filled into the trench to form a trench capacitor.

FIGS. 2A–2F show a fabricating process for the trench capacitor disclosed in L. Nesbit, et al., "A 0.6 μm 256 Mb trench DRAM cell With Selft-Aligned BuriEd STrap (BEST)", 1993 IEDM, pp. 627–630. As shown in FIG. 2A, an epi layer 210 is formed on a P– substrate 200. Then a silicon oxide layer 220 and a silicon nitride layer 221 are formed to protect the epi layer 210. A predetermined pattern is used to expose a photoresist layer (not shown in FIG. 2A) and a trench 230 is etched a predetermined depth into the P– substrate 200.

Next, as shown in FIG. 2B, a capacitor plate 240 for storing charges for the trench capacitor is formed in the substrate 200 by outdiffusing a N+ material, e.g. arsenic or phosphorus, from the lower portion of the trench 230. A dielectric layer 250, for example, an oxide nitride (ON) layer, is deposited on the capacitor plate 240 to form a trench 231.

After depositing N+ polysilicon as a conductive material through CMP (Chemical Mechanical Polishing), and then recess-etching the polysilicon and striping a portion of the oxide nitride (ON) layer, a first conductive portion 260 and a dielectric layer 250' are formed as shown in FIG. 2C. Then trench 231 in FIG. 2B changes into a trench 232.

In FIG. 2D, a collar silicon oxide layer 270 is deposited around on the side-wall of the trench 232 and a second conductive portion 261 is filled in the deposited trench (not shown in FIG. 2D) by well-known techniques for the semiconductor process. The collar silicon oxide layer 270 may be deposited by silicon oxide to insulate against leakage current. The second conductive portion 261 may be formed by depositing polysilicon heavily doped by arsenic or phosphorus.

Then the collar silicon oxide layer 270 and the second conductive portion 261 are recess-etched. The result is shown in FIG. 2E, wherein the collar silicon oxide layer 270 and the second conductive portion 261 become a collar silicon oxide layer 270' and a third conductive portion 261', respectively. It is noted that in the above step of forming a trench 233, to etch to the silicon oxide in collar silicon oxide layer 270 and the polysilicon in the second conductive portion 261 requires two depth decisions for two different materials and two selective etchings.

At last, as shown in FIG. 2F, N+ polysilicon is deposited in the trench 233 in FIG. 2E to form a fourth conductive portion 262, completing the trench capacitor for use in the next step of constructing a DRAM cell.

However, whether isotropic or anisotropic etching is used to perform the two selective etchings, two depth decisions have to be individually made with respect to two different materials, making the semiconductor process will become more difficult. Furthermore, before these two etchings, two associated photolithography processes are necessary. In addition, after depositing the fourth conductive portion 262, if the etching process of the collar silicon oxide layer 270 has failed, or the depth of the collar silicon oxide layer 270 in FIG. 2C is too small, a leakage current is caused between the capacitor plate 240 in FIG. 2 and the fourth conductive portion 262 since both of the charge storage areas are too close and therefore can short if operated under a high voltage. Thus, the charge storage performance of the trench capacitor will be negatively effected.

SUMMARY OF THE INVENTION

It is therefore an object of the present invention to provide a method of making a trench capacitor reducing the cost of fabrication by using one less photolithography process and etching depth decision than the prior art, while ensuring that the leakage current is inhibited.

The method of making a trench capacitor with respect to the present invention comprises the following steps. First, provide a semiconductor substrate; form a first trench of predetermined depth into said semiconductor substrate; form an electrode plate on the side-wall of said bottom of said first trench; form a dielectric layer on said electrode plate; form a first conductive portion on said dielectric layer, wherein said first conductive portion fills the bottom of said first trench to form a second trench; form a insulation layer to fill the bottom portion of said second trench to make a third trench in said second trench; form a conductive spacer along the side-wall of said third trench; etch said insulation layer aligned with said conductive spacer as a mask and then form a fourth trench; and lastly, fill said fourth trench with a conductive material.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 3A:
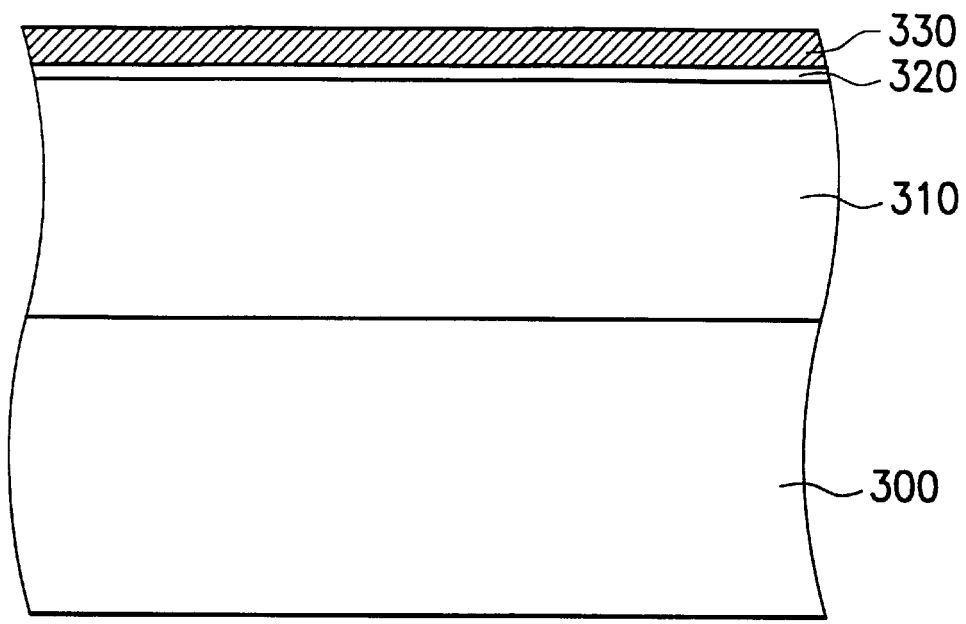
FIGS. 3A~3K shows a cross sectional view of a structure of a trench capacitor of the fabrication process according to the present invention.

Referring to FIGS. 3A~3K, the preferred embodiment in accordance with the present invention is illustrated. First, as shown in FIG. 3A, a semiconductor substrate 300 is provided, which may be formed by N+ polysilicon. Next, an epi layer 310, and a silicon oxide layer 320, a silicon nitride layer 330 are sequentially formed on the semiconductor substrate 300, wherein the silicon oxide layer 320 and the silicon nitride layer 330 are used to protect the semiconductor substrate 300 and the epi layer 310.

Figure 3B:
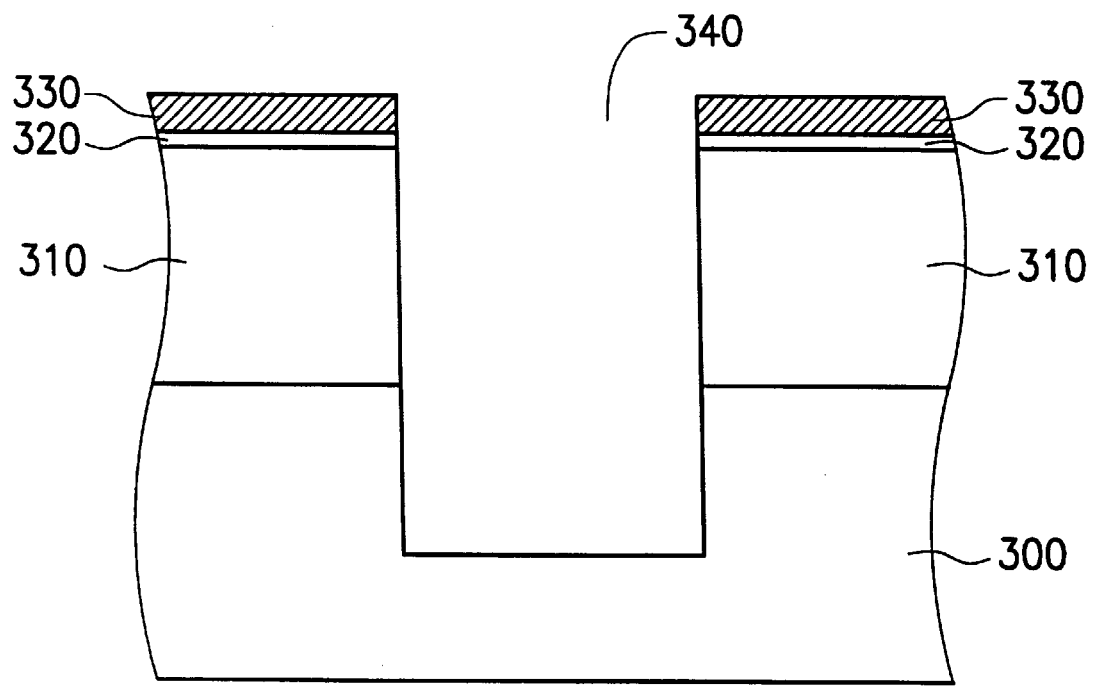

In FIG. 3B, after photolithography and etching processes, a trench 340 is formed into the semiconductor substrate 300. The depth of the trench 300 depends on the practical requirements. The depth of such trench in DRAM, for example, the 16M DRAM, is about 6~7 μm.

Figure 3C:
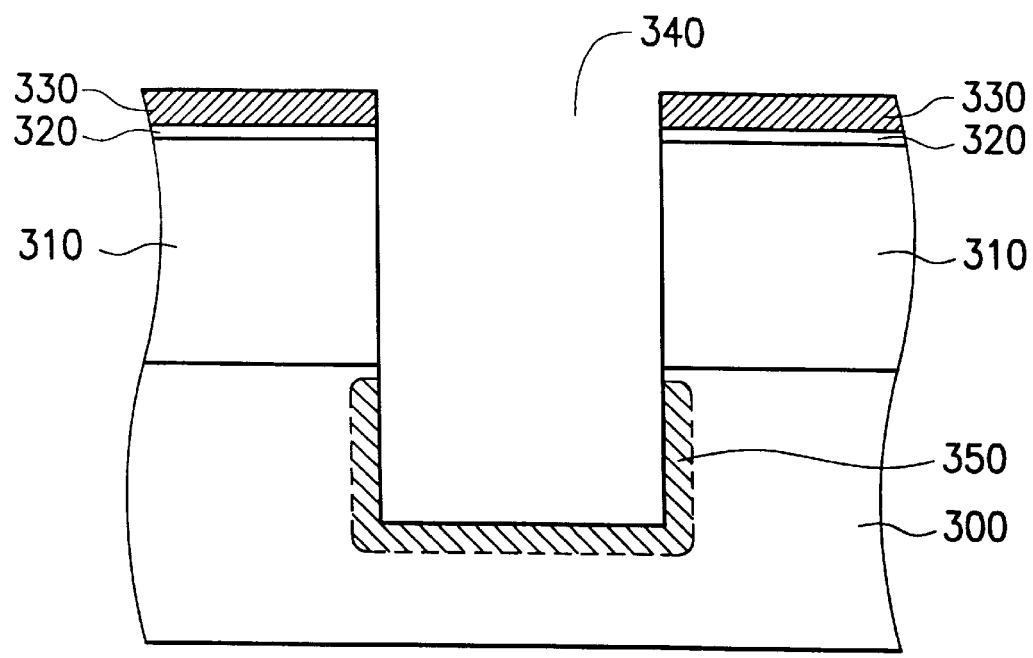

Referring to FIG. 3C, subsequently, as in the step described in the above prior art, an N+ material, for example, arsenic or phosphorus, is driven in and diffused into the lower portion of the side-wall of the trench 340 to produce a buried N+ plate 350 as an electrode plate of the trench capacitor for storing charges. The method of ion implantation can also be applied to form the electrode plate.

Figure 3D:
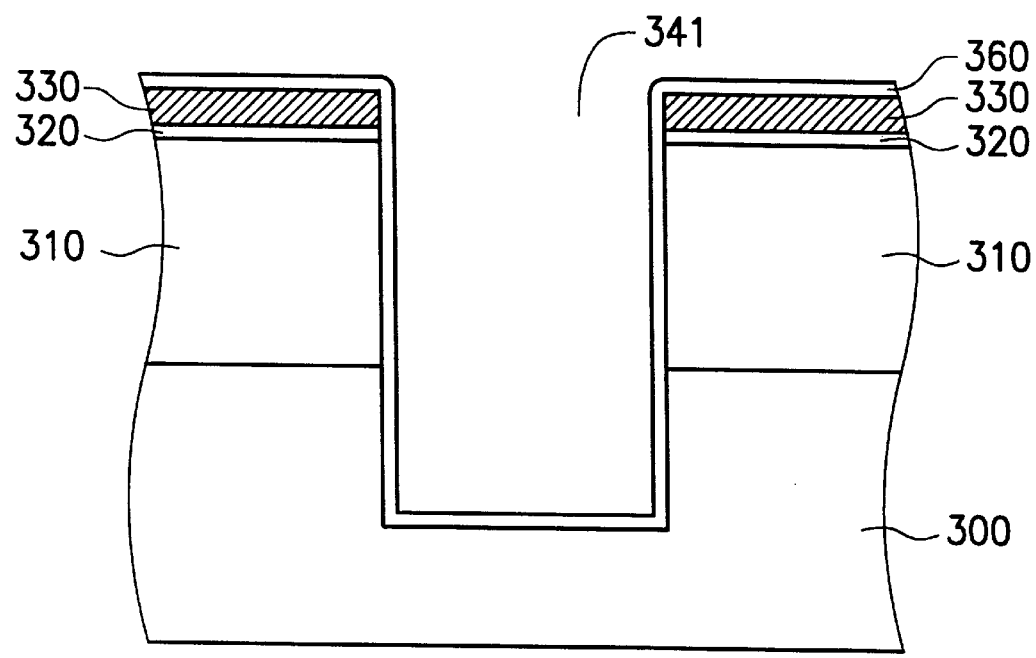
Figure 3E:
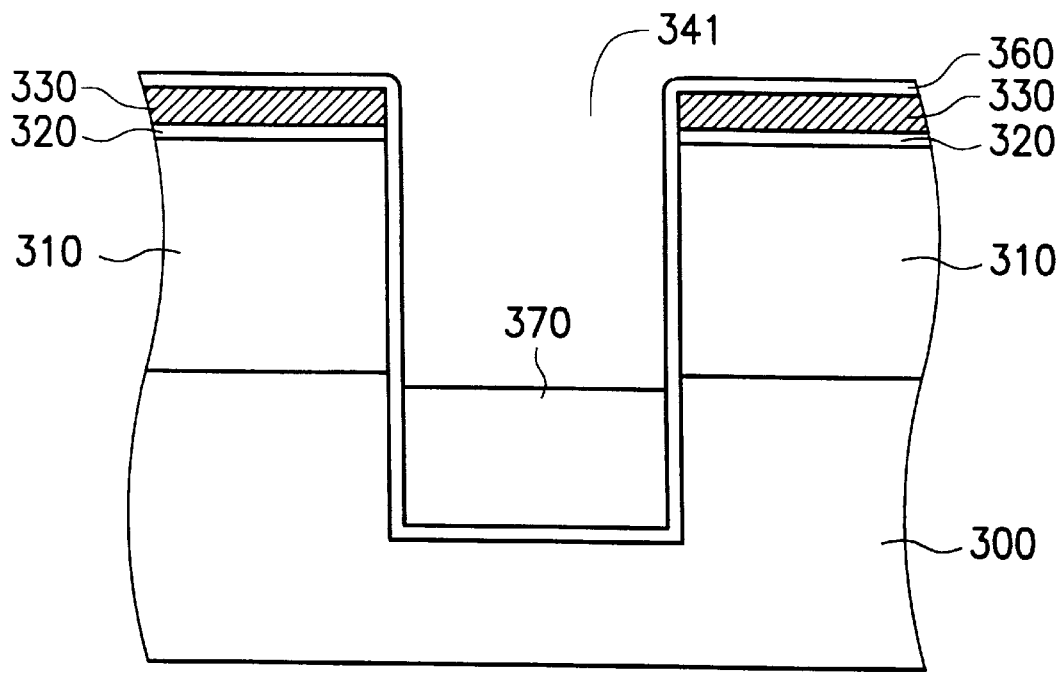

In FIG. 3D, a dielectric layer 360 is formed. The dielectric layer 360 may be composed of silicon oxide/silicon nitride (ON) or silicon oxide/silicon nitride/silicon oxide (ONO) and is about 40~60 Å thick.

Figure 3F:
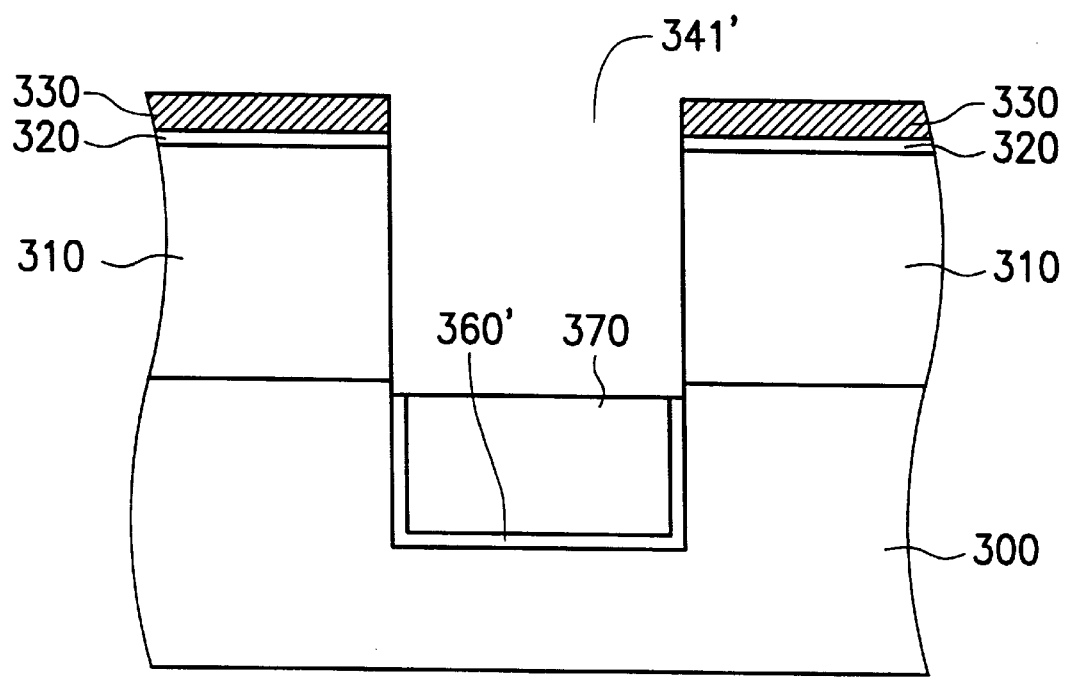

Next, N+ type polysilicon, e.g. doped with arsenic or phosphorus, is deposited. After CMP, the N+ doped polysilicon is recess-etched to form a first conductive portion 370 in FIG. 3E, usually about 2000~3000 Å thick. The dielectric layer 360 is stripped away and a dielectric layer 360' remains. Then a trench 341' is formed as shown in FIG. 3F.

Figure 3G:
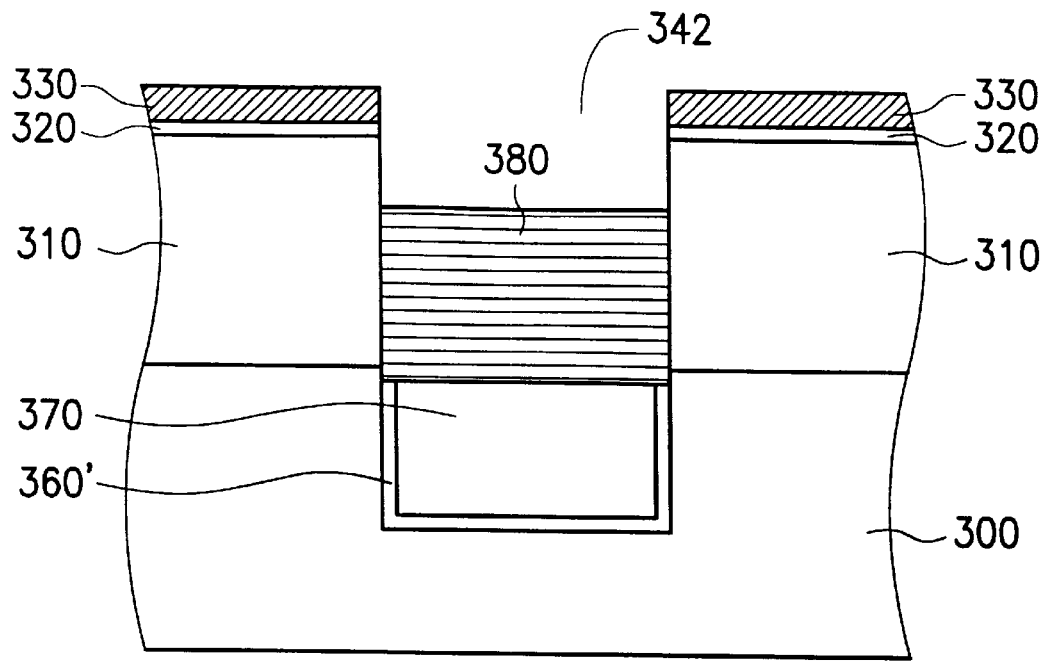
Figure 3H:
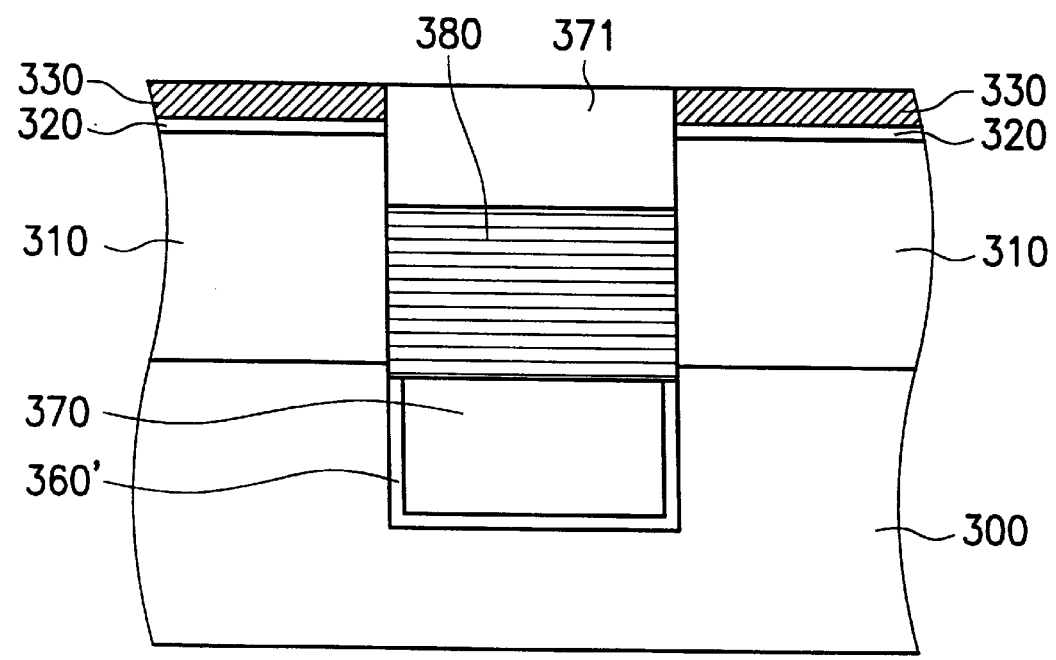
Figure 3H:
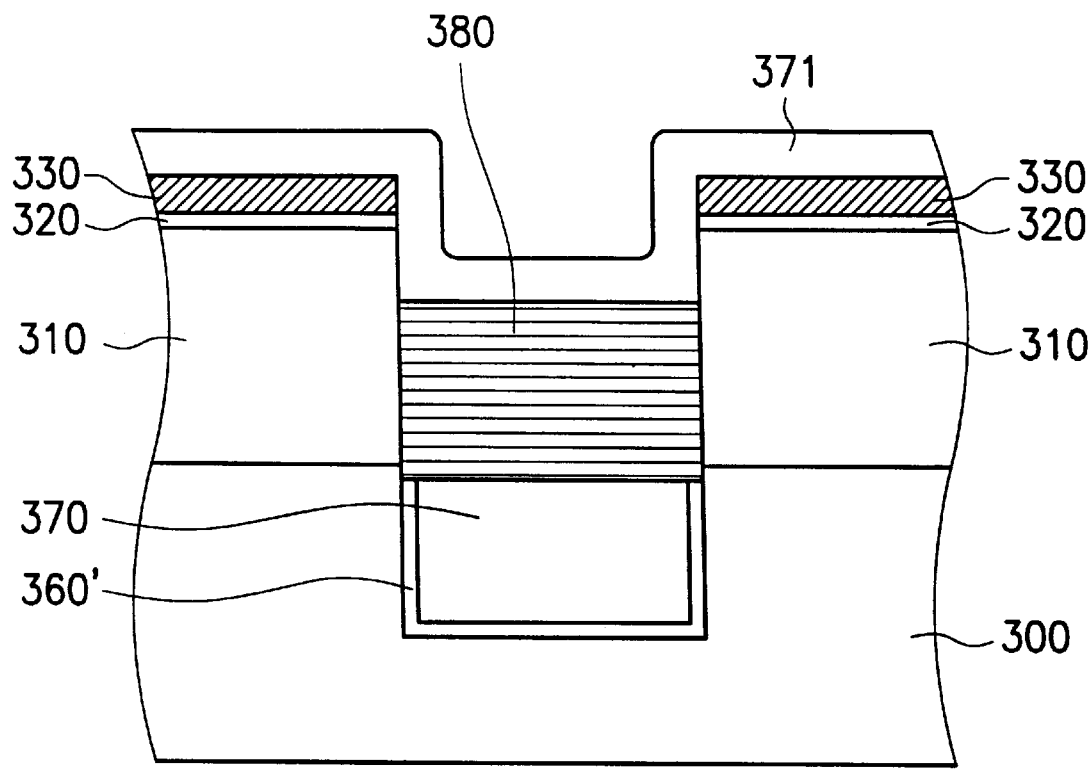

FIG. 3G shows an insulation layer 380 deposited upon the dielectric layer 360' and the first conductive portion 370 in the trench 341'. The insulation layer 380 can be composed of an insulating material like silicon oxide and produced by the low pressure and high density process of chemical vapor deposition (CVD). In practice, the thickness of the insulation layer 380 is about 5000~10000 Å. Thereafter, referring to FIG. 3H, fill N type polysilicon in the trench 342 shown in FIG. 3G, or referring to FIG. 3H', deposit N type polysilicon to form a second conductive portion 371.

Figure 3I:
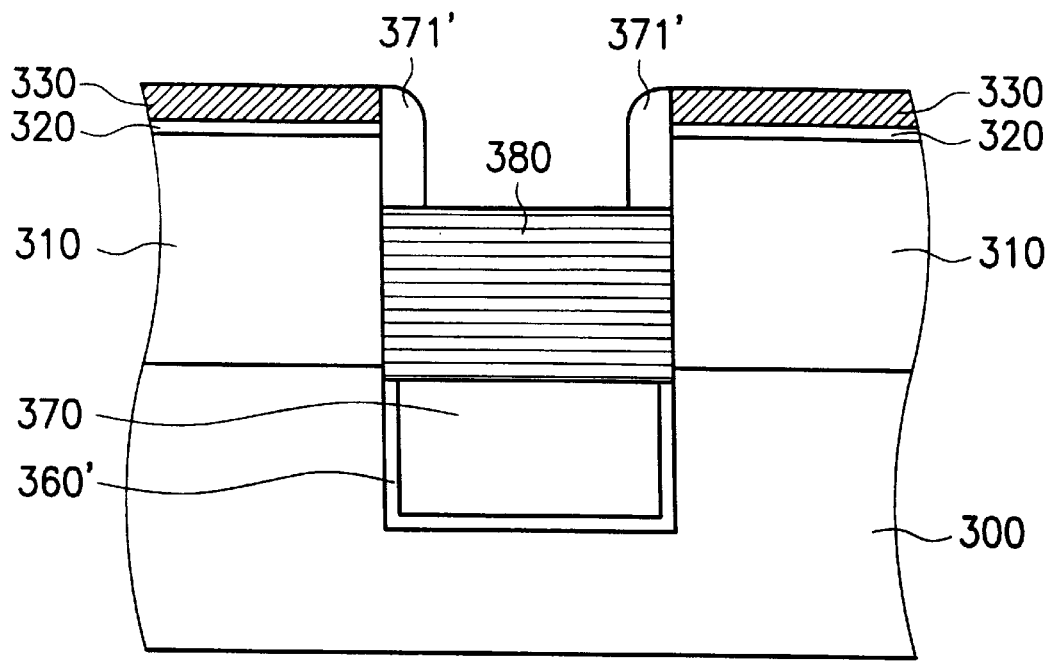
Figure 3J:
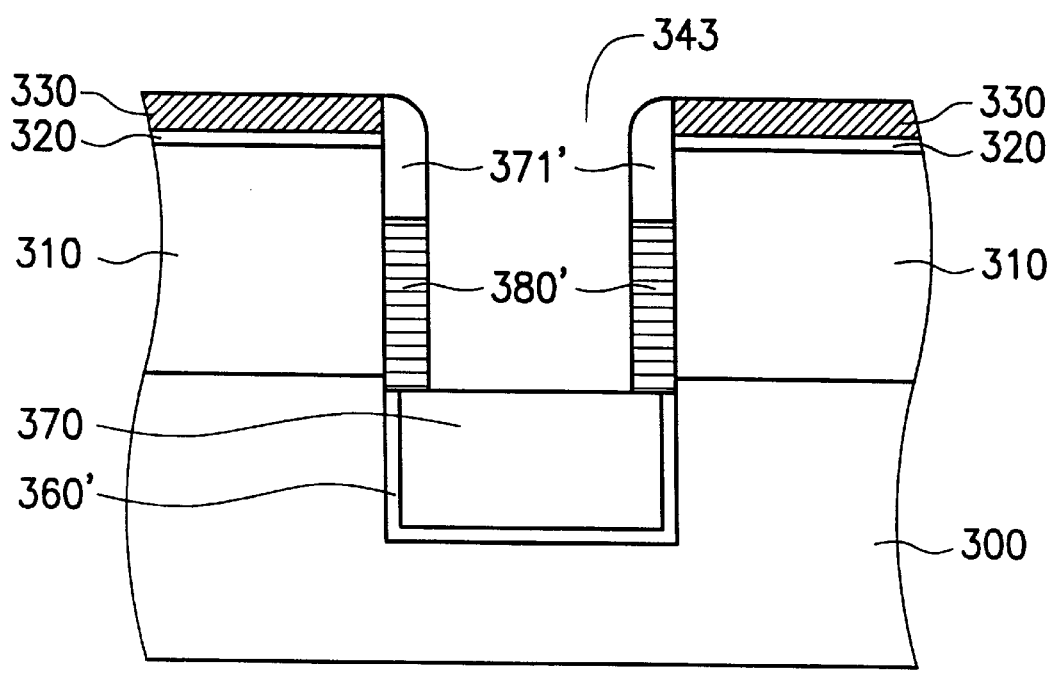
Figure 3K:
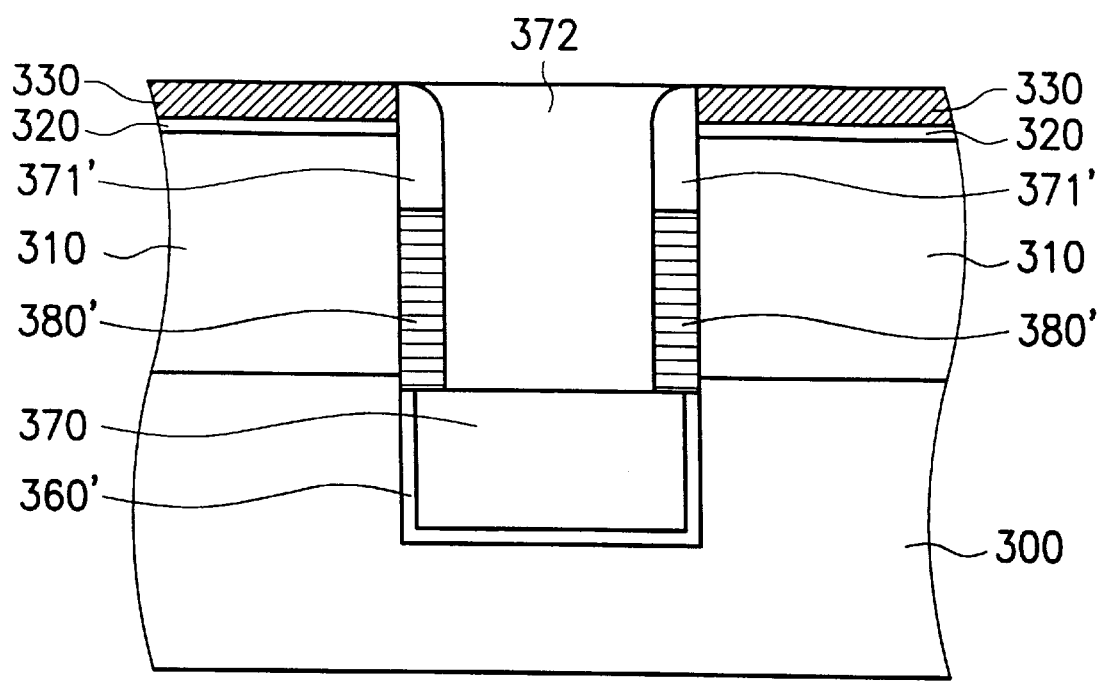

After using one of the above two methods to form the second conductive portion 371, the second conductive portion 371 and the insulation layer 380 are etched back to form a spacer 371' shown in FIG. 3I and a spacer 380' in FIG. 3J, both around the side-wall of trench 343. Lastly, as shown in FIG. 3K, a conductive material like N+ type polysilicon, e.g. doped arsenic or phosphorus, is deposited to fill the trench 343 to form a third conductive layer 372, thus finishing the processes of making the trench capacitor.

Figure 1:
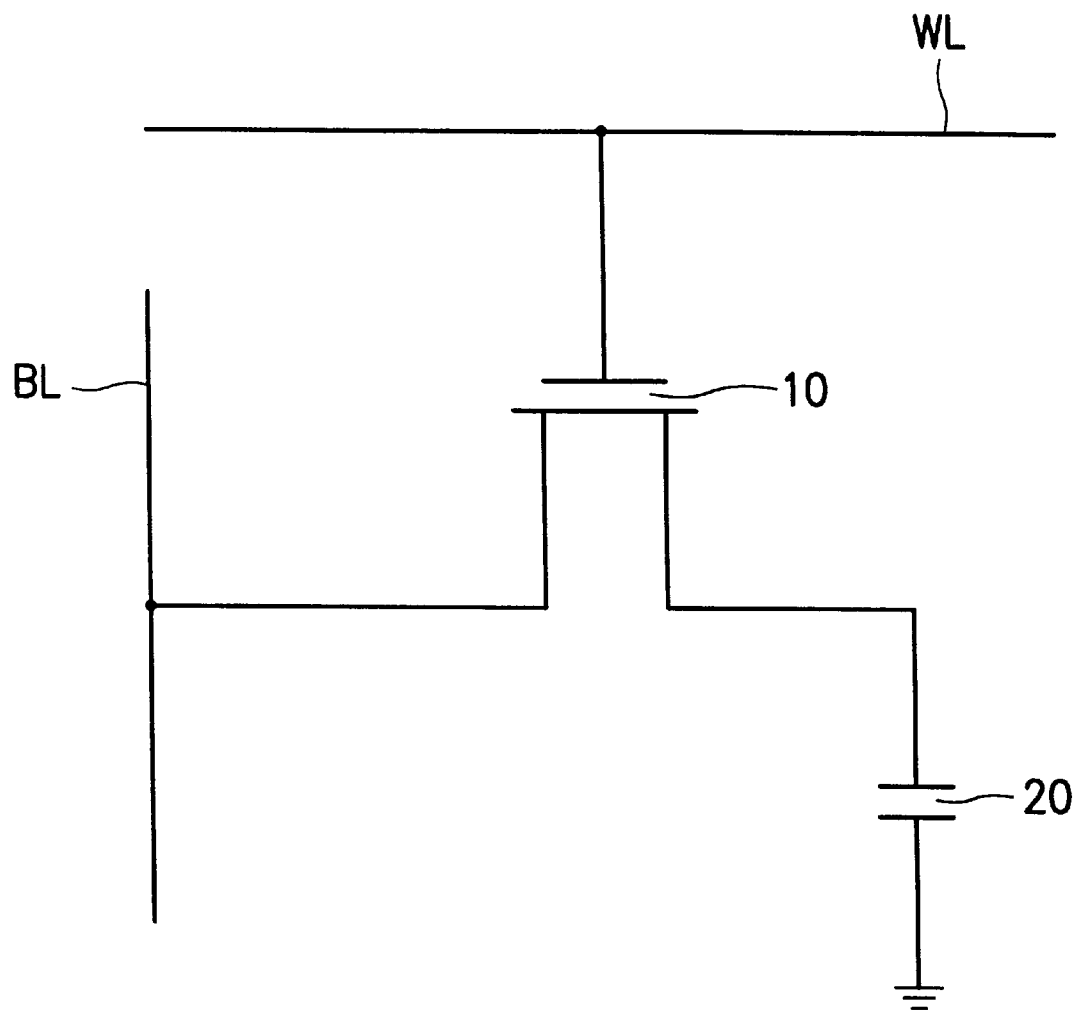
FIG. 1 shows a circuit structure illustration of a DRAM cell.
Figure 2A:
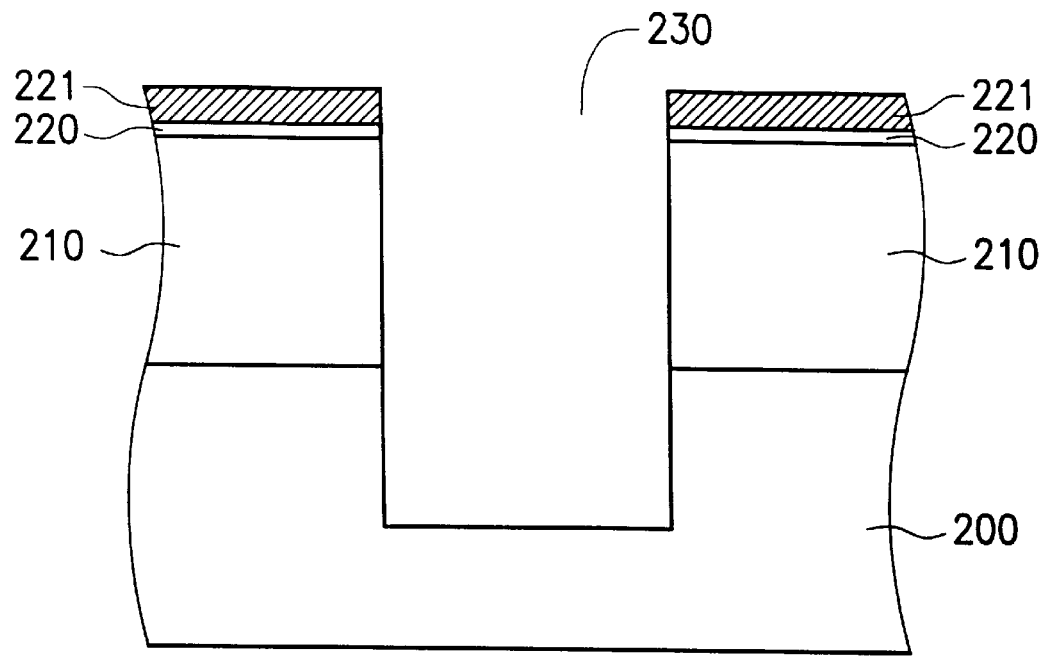
FIGS. 2A~2F shows a cross sectional view of a structure of a trench capacitor of the fabrication process according to the prior art.
Figure 2B:
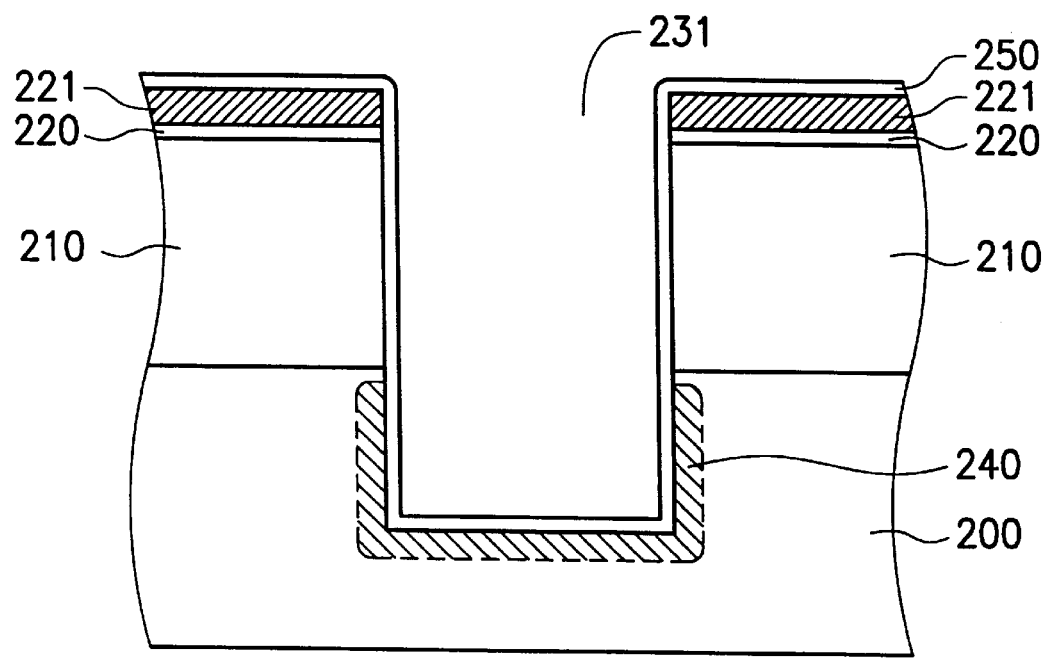
Figure 2C:
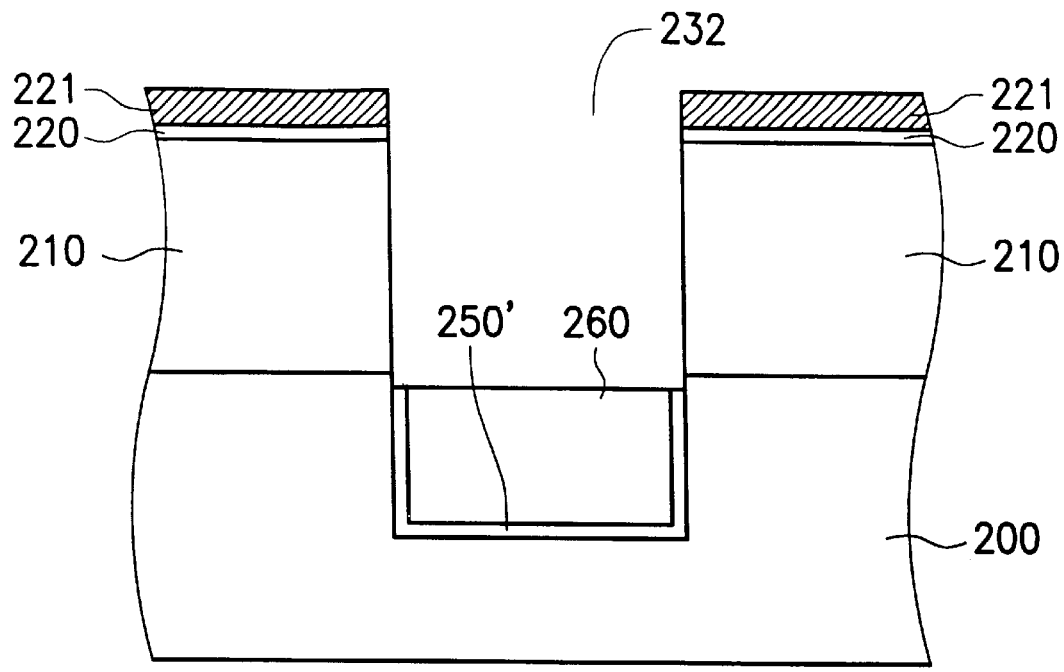
Figure 2D:
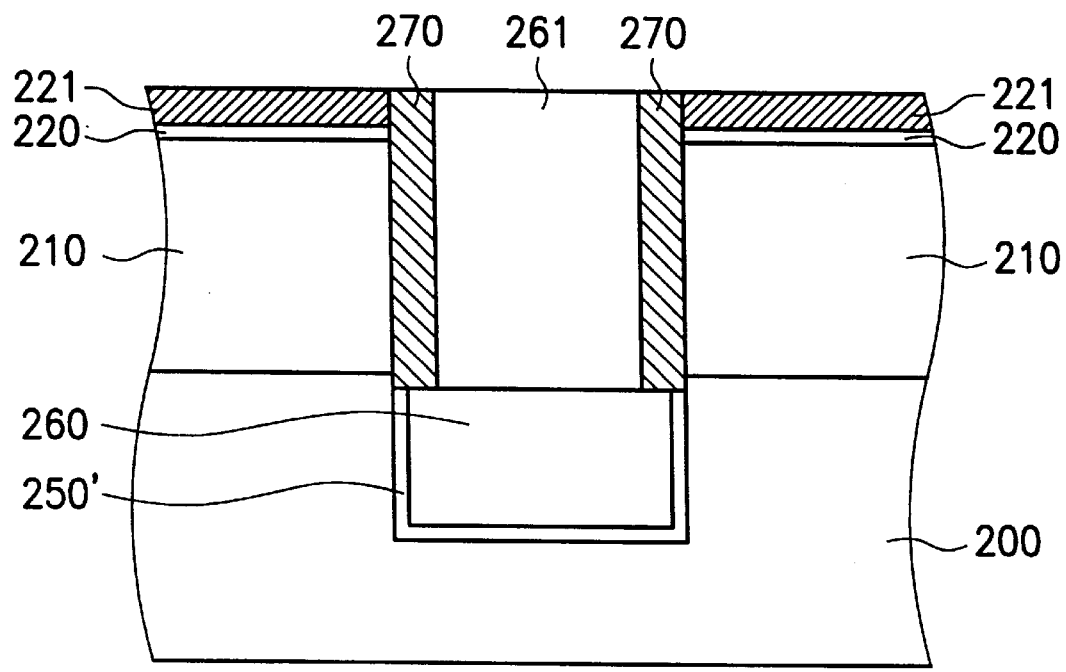
Figure 2E:
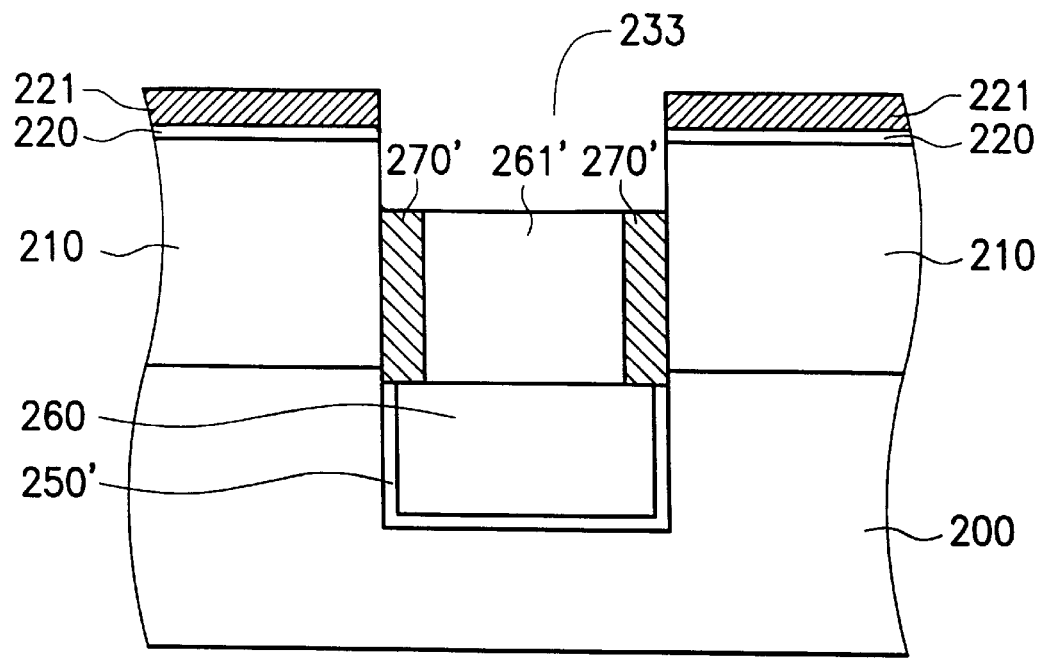
Figure 2F:
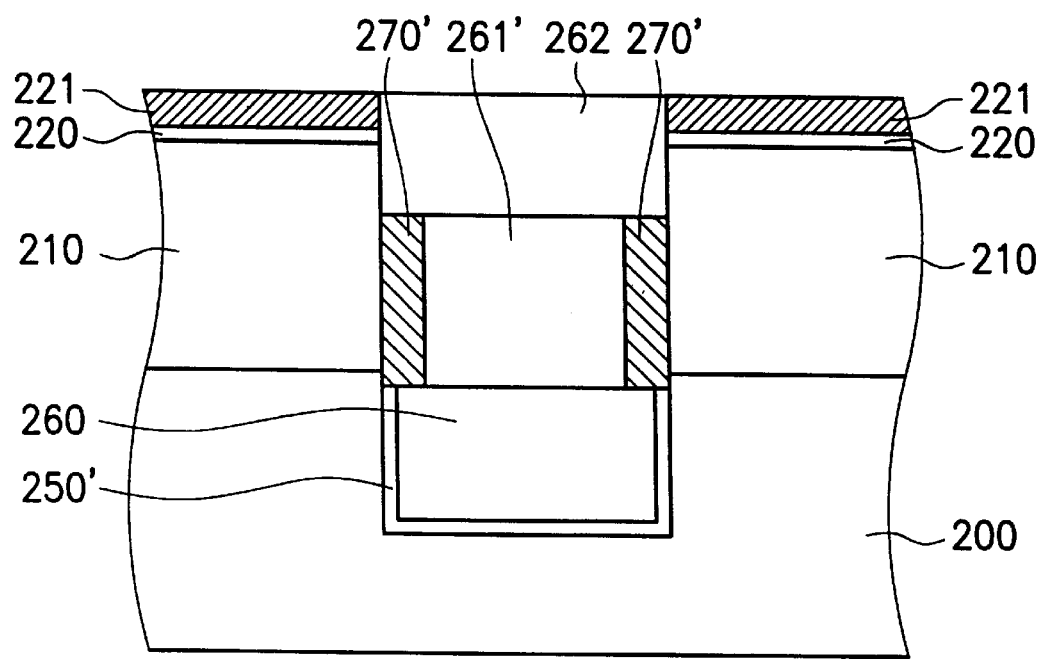

To form the same two spacers 371' and 380' shown in FIG. J and the third conductive layer 372, the aforementioned prior arts need, in addition to the etching processes shown in the present invention, the extra pre-decisions for achieving the same etching depths of the insulation layer (collar silicon oxide layer) 270 and the second conductive portion 260 shown in FIG. 2D to form the insulation layer (collar silicon oxide layer) 270' and the third conductive portion 260' shown in FIG. 2E, which increases the difficulty of making the trench capacitors. In the present invention, there is no requirement to pre-decide the depths for the two different materials using either isotropic or anisotropic etching when forming the two spacers 371' and 380' shown in 3J. Furthermore, according to the present invention, a photolithography process can be omitted in forming the spacer 380' by spacer-etching aligned with the spacer 371'. Therefore, the method of making the trench capacitor with respect to the present invention is easier than those disclosed in the prior arts.

What is claimed is:

1. A method of making a trench capacitor, comprising the steps of:
   (a) providing a semiconductor substrate;
   (b) forming a first trench of predetermined depth into said semiconductor substrate;
   (c) forming a electrode plate on the side-wall of the bottom of said first trench;
   (d) forming a dielectric layer on said electrode plate;
   (e) forming a first conductive portion on said dielectric layer, wherein said first conductive portion fills the bottom of said first trench to form a second trench;
   (f) forming an insulation layer to fill the bottom portion of said second trench to make a third trench in said second trench;
   (g) forming a conductive spacer along the side-wall of said third trench;
   (h) etching said insulation layer using said conductive spacer as a mask and then forming a fourth trench; and
   (i) filling said fourth trench with a conductive material.

2. The method as in claim 1 wherein said electrode plate in step (c) is formed by presetting and driving in N+ type ions to the side-wall of said first trench.

3. The method as in claim 1 wherein said dielectric layer in step (d) is formed with silicon oxide/silicon nitride/silicon oxide (ONO) to a thickness of about 40~60 Å.

4. The method as in claim 1 wherein said first conductive portion in step (e) is formed by a N+ type polysilicon at about 5E20 per $cm^3$.

5. The method as in claim 1 wherein step (e) comprises the following steps:
   (e1) depositing a N+ type polysilicon layer on the surface of said semiconductor substrate and filling said first trench;

(e2) planarizing the surface of said semiconductor substrate; and (e3) etching said N+ type polysilicon layer formed in step (e1) to a predetermined depth to form said second trench.

6. The method as in claim 5 wherein said planarization in step (e3) is realized by a method of chemical mechanic polishing (CMP).

7. The method as in claim 1 wherein said insulation layer in step (f) comprises at least a silicon oxide layer.

8. The method as in claim 1 wherein step (f) comprises:

(f1) depositing a silicon oxide layer on the surface of said semiconductor substrate and filling said second trench;

(f2) planarizing the surface of said semiconductor substrate; and (f3) etching said insulation layer to a predetermined depth to form said third trench.

9. The method as in claim 8 wherein said silicon oxide layer is deposited by low pressure chemical vapor deposition.

10. The method as in claim 8 wherein said planarization in step (f2) is realized by a method of chemical mechanic polishing (CMP).

11. The method as in claim 8 wherein said insulation layer in step (f3) is etched by diluent dilute hydrofluoric acid (DHF).

12. The method as in claim 1 wherein said conductive spacer in step (g) is formed by N+ type polysilicon.

13. The method as in claim 1 wherein said conductive material in step (i) is N+ type polysilicon.

14. A method of making a trench capacitor, comprising:

(a) providing a semiconductor substrate;

(b) forming a first insulation layer on said semiconductor substrate;

(c) forming a second insulation layer on said first insulation layer;

(d) defining an opening on said second insulation layer by depositing a mask and etching said second insulation layer using a photolithography process;

(e) forming a first trench of a predetermined depth into said semiconductor substrate;

(f) forming an electrode plate on the side-wall of said bottom of said first trench;

(g) forming a dielectric layer on said electrode plate;

(h) forming a first conductive portion on said dielectric layer, wherein said first conductive portion fills the bottom of said first trench to form a second trench;

(i) forming a insulation layer to fill the bottom portion of said second trench to make a third trench in said second trench;

(j) forming a conductive spacer with N+ type polysilicon along the side-wall of said third trench;

(k) etching said insulation layer aligned with said conductive spacer as a mask and forming a fourth trench; and (l) filling said fourth trench with a conductive material.

15. The method as in claim 14 wherein said first insulation layer in step (b) is formed by silicon oxide, with a thickness of about 100 Å.

16. The method as in claim 14 wherein said second insulation layer in step (c) is formed by silicon nitride, with a thickness of about 2000 Å.

17. The method as in claim 14 wherein said electrode plate in step (f) is formed by presetting and driving in N+ type ions to the side-wall of said first trench.

18. The method as in claim 14 wherein said dielectric layer in step (g) is formed by silicon oxide/silicon nitride/silicon oxide (ONO), with a thickness of about 40~60 Å.

19. The method as in claim 14 wherein said first conductive portion in step (h) is formed by a N+ type polysilicon at about 5E20 per cm$^3$.

20. The method as in claim 14 wherein step (h) comprises the following steps:

(h1) depositing a N+ type polysilicon layer on the surface of said semiconductor substrate and filling said first trench;

(h2) planarizing the surface of said semiconductor substrate; and (h3) etching said N+ type polysilicon layer formed in step (h1) to a predetermined depth to form said second trench.

21. The method as in claim 20 wherein said planarization in step (h3) is realized by a method of chemical mechanical polishing (CMP).

22. The method as in claim 14 wherein said insulation layer in step (i) comprises at least a silicon oxide layer.

23. The method as in claim 14 wherein step (i) comprises:

(i1) depositing a silicon oxide layer on the surface of said semiconductor substrate and filling said second trench;

(i2) planarizing the surface of said semiconductor substrate; and (i3) etching said insulation layer to a predetermined depth to form said third trench.

24. The method as in claim 23 wherein said silicon oxide layer is deposited by low pressure chemical vapor deposition.

25. The method as in claim 23 wherein said planarization in step (i2) is realized by a method of chemical mechanical polishing (CMP).

26. The method as in claim 23 wherein said insulation layer in step (i3) is etched by dilute hydrofluoric acid (DHF).

27. The method as in claim 14 wherein said conductive spacer in step (i) is formed by N+ type polysilicon.

* * * * *